United States Patent [19]

Kennedy

[11] Patent Number: 4,581,594
[45] Date of Patent: Apr. 8, 1986

[54] DRIVE CIRCUIT FOR YIG TUNED DEVICES

[75] Inventor: Jonathon L. Kennedy, Fairfield, Calif.

[73] Assignee: Systron Donner Corporation, Concord, Calif.

[21] Appl. No.: 593,914

[22] Filed: Mar. 27, 1984

[51] Int. Cl.[4] ............................................. H03B 0/00
[52] U.S. Cl. .................................. 331/177 R; 331/96; 307/270; 333/235
[58] Field of Search .................. 307/264, 270; 331/96, 331/107 DP, 117 D, 177 R; 333/205, 219, 235; 334/4

[56] References Cited

U.S. PATENT DOCUMENTS 3,628,067  12/1971  Womack et al. ..................... 307/270
3,947,776  3/1976   Stevens et al. .................. 307/270 X

*Primary Examiner*—Eugene R. LaRoche
*Assistant Examiner*—James C. Lee
*Attorney, Agent, or Firm*—James F. Mitchell

[57] ABSTRACT

A stable, low noise voltage-to-current converter is provided to control the tuning current in YIG tuned devices such as YIG tuned transistor oscillators. The circuit provides stable tuning current which is substantially noise free.

2 Claims, 2 Drawing Figures

DRIVE CIRCUIT FOR YIG TUNED DEVICES

SUMMARY OF THE INVENTION

YIG (yttrium iron-garnet) tuned devices such as YIG tuned transistor oscillators are well-known wherein the frequency of the oscillator is varied by varying the current to the tuning coils of the device.

The present invention provides a stable, low noise voltage-to-current converter for controlling the tuning current of a YIG tuned oscillator. The circuit is extremely stable and low in noise content and, additionally, includes a bandwidth switch which permits a high tuning speed during tuning voltage transitions and a low noise level when the tuning voltage is stabilized.

Thus, the present invention provides a circuit which permits fast tuning speeds during transitional periods, yet one which is low in noise while the oscillator frequency is not being changed.

DESCRIPTION OF THE PREFERRED EMBODIMENTS

Figure 1:
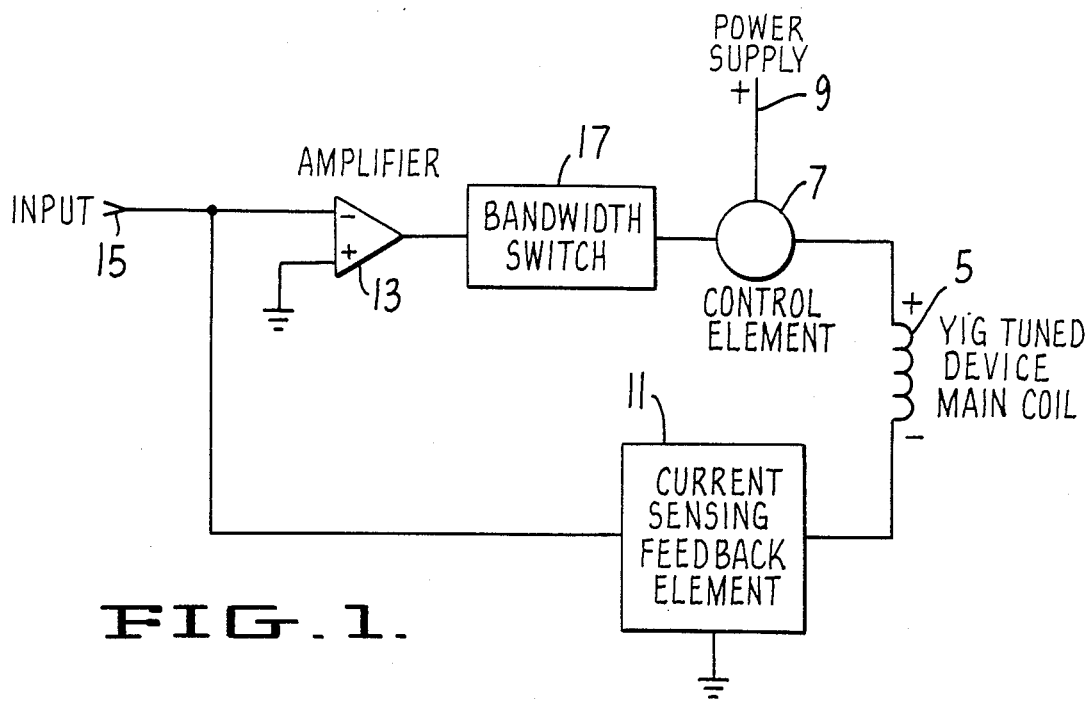
FIG. 1 is a block diagram of a circuit embodying the present invention.

In FIG. 1 the main coil of a YIG tuned device designated 5 is supplied with drive current from control current source 7 and power supply 9. Current through the main coil 5 is sensed by current sensing feedback means 11 and a derived voltage is fed to an operational amplifier 13 after being combined with the input tuning control voltage at 15. The voltage output from the amplifier 13 is passed through a bandwidth switch 17 to the control current source 7. The bandwidth switch 17 is one which permits rapid tuning speed during tuning transitions, yet does not introduce noise into the circuit once the control voltage becomes stable. Placement of the main coil 5 between the control current source 7 and the current sensing means 11 provides direct control over coil current stability and noise level.

Figure 2:
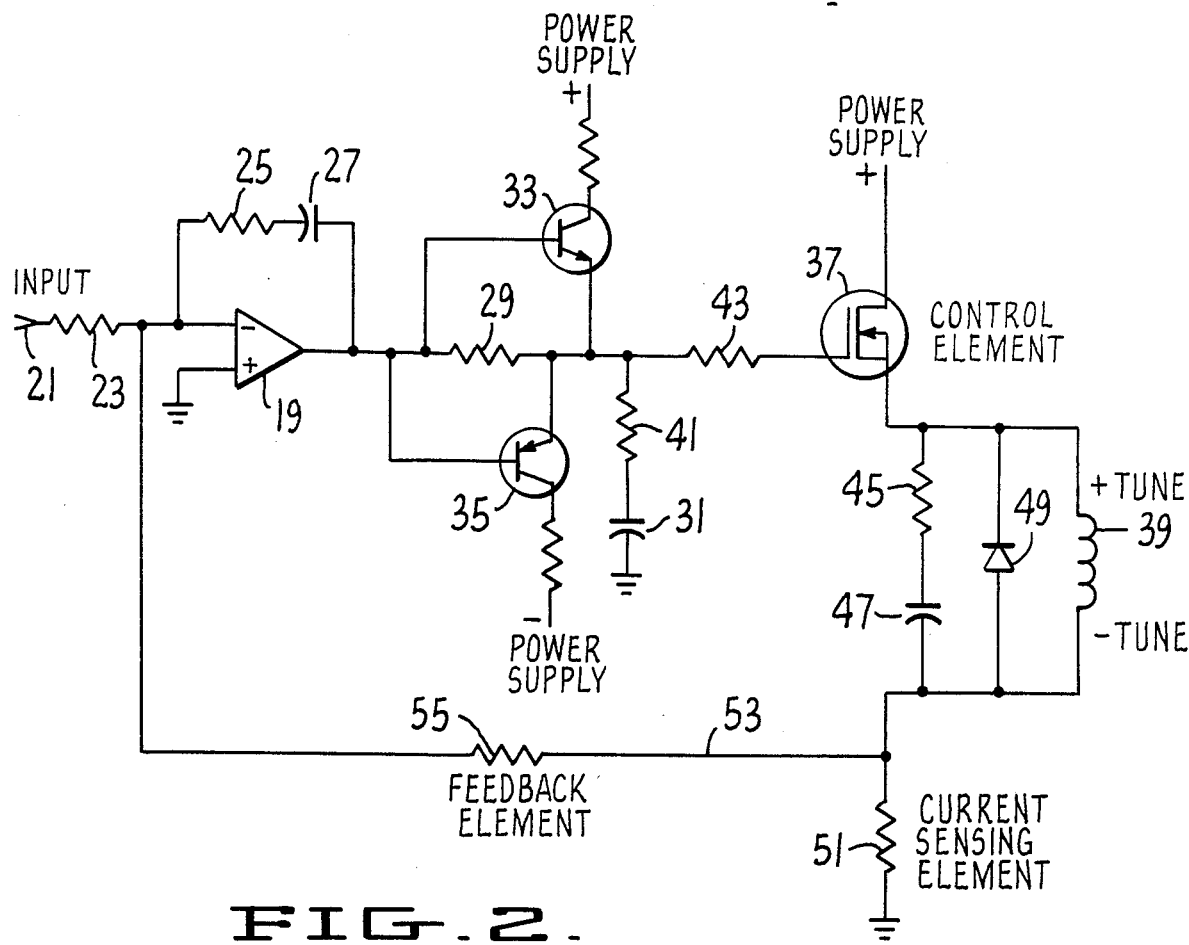
FIG. 2 is a detailed circuit diagram of a practical embodiment of the present invention.

FIG. 2 shows a practical circuit embodying the present invention. In this circuit, the operational amplifier 19 provides control of the main coil current and feedback error voltage for stability. An input control voltage at 21 is introduced to the inverting input of amplifier 19 through input resistor 23 which provides interface for operating set point. The resistor 25 and capacitor 27 provide a feedback circuit which prevents amplifier oscillation. Resistor 29 and capacitor 31 establish a low noise operating point when the oscillator frequency has stabilized. In other words, when no excursion of control voltage is introduced at 21, these elements provide a stabilized voltage to control the YIG tuned oscillator at its selected constant frequency.

Switch transistors 33 and 35 are of the NPN and PNP types, respectively. Their collectors connect to the positive and negative poles of the power supply, the bases of both transistors connect to the output of the operational amplifier 19 at one end of resistor 29 and their emitters connect across resistor 29 at its other end. These transistors provide a bandwidth switch which permits fast tuning during transitions when an appropriate one of them is forward biased and switches on to short out resistor 29 and to rapidly charge capacity 31 to the transition tuning voltage.

Control current source 37 may be a field effect transistor which serves as a voltage-to-current converter. It is directly connected to and supplies control current to the tuning coil 39 of the YIG oscillator in response to control voltage supplied through gate resistor 43. Transistors 41 and 43 stabilize the circuit. Resistor 45 and capacitor 47 serve as a damping network for tuning coil 39. Diode 49 suppresses reverse voltage transients. Resistor 51 connected between one end of tuning coil 39 and ground serves as the current sensing means and the voltage drop across this resistor feeds back through line 53 and resistor 55 to the inverting input of the operational amplifier 19 where it is combined with control voltage 21.

The stability of the circuit is determined by resistors 23, 51 and 55 as well as the precision operational amplifier 19. Noise performance is determined by resistor 29 and capacitor 31.

In one practical embodiment, the circuit values which have been used for tuning control of a 12–18 GHz YIG tuned oscillator are as follows:

| | |
|---|---|
| amplifier 19 | AD542L |
| resistor 23 | 10K ohms |
| resistor 25 | 499K ohms |
| capacitor 27 | .033 microfarads |
| resistor 29 | 100K ohms |
| capacitor 31 | 22 microfarads |
| transistor 33 | 2N3904 |
| transistor 35 | 2N3906 |
| power transistor 37 | Siliconix VN46AF |
| resistor 41 | 1.5K ohms |
| resistor 43 | 100 ohms |
| resistor 45 | 47 ohms |
| capacitor 47 | 1 microfarad |
| resistor 51 | 2 ohms |
| resistor 55 | 4.99K ohms |

The circuit of the present invention is a substantial improvement over previous circuits in that it provides isolation from power supply noise and ground loops, both of which can degrade the output performance of YIG tuned devices.

I claim:

1. A low noise, stable voltage-to-current tuning control circuit for supplying drive current to the tuning coil of a YIG tuned device comprising:
    (a) a source of drive current connected to one end of said tuning coil;
    (b) an operational amplifier supplying a tuning control voltage to the source of drive current;
    (c) current sensing means connected to the other end of said tuning coil and deriving a feedback voltage responsive to the coil drive current;
    (d) a feedback resistor connecting the feedback voltage to the operational amplifier; and
    (e) a bandwidth switch connected between the output of said operational amplifier and the source of drive current, wherein the bandwidth switch comprises a resistor, a pair of bipolar transistors of opposite types with the bases of the two transistors connected to the output of the operational amplifier and one end of the resistor and with the emitters of the transistors connected at the other end of the resistor to the source of drive current and a capacitor connecting the transistor emitters to ground permitting the appropriate transistor to short out the resistor and charge the capacitor for fast tuning during transitions.

2. The circuit of claim 1 wherein the current sensing means is a resistor in series with the drive current supplied to the tuning coil.

* * * * *